United States Patent
Chen et al.

(10) Patent No.: US 9,466,608 B1
(45) Date of Patent: Oct. 11, 2016

(54) SEMICONDUCTOR STRUCTURE HAVING A DUAL-GATE NON-VOLATILE MEMORY DEVICE AND METHODS FOR MAKING SAME

(71) Applicant: FREESCALE SEMICONDUCTOR, INC., Austin, TX (US)

(72) Inventors: Weize Chen, Phoenix, AZ (US); Richard J De Souza, Chandler, AZ (US); Patrice M Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/925,933

(22) Filed: Oct. 28, 2015

(51) Int. Cl.
| | |
|---|---|
| H01L 21/336 | (2006.01) |
| H01L 27/115 | (2006.01) |
| H01L 27/092 | (2006.01) |
| H01L 29/51 | (2006.01) |
| H01L 29/423 | (2006.01) |
| H01L 21/28 | (2006.01) |
| H01L 21/3213 | (2006.01) |
| H01L 21/324 | (2006.01) |
| H01L 21/8238 | (2006.01) |

(52) U.S. Cl.
CPC ... *H01L 27/11568* (2013.01); *H01L 21/28035* (2013.01); *H01L 21/28282* (2013.01); *H01L 21/324* (2013.01); *H01L 21/32139* (2013.01); *H01L 21/823864* (2013.01); *H01L 27/0922* (2013.01); *H01L 27/11573* (2013.01); *H01L 29/42344* (2013.01); *H01L 29/42348* (2013.01); *H01L 29/511* (2013.01); *H01L 29/518* (2013.01)

(58) Field of Classification Search
None
See application file for complete search history.

(56) References Cited

U.S. PATENT DOCUMENTS

| | | | | |
|---|---|---|---|---|
| 6,275,430 | B1* | 8/2001 | Ka | G11C 11/4096 365/189.05 |
| 6,713,347 | B2* | 3/2004 | Cappelletti | H01L 27/105 257/324 |
| 7,364,969 | B2 | 4/2008 | Prinz et al. | |
| 7,579,243 | B2 | 8/2009 | Kang et al. | |
| 7,838,363 | B2 | 11/2010 | Steimle et al. | |
| 7,897,448 | B1* | 3/2011 | Mehta | G11C 16/10 257/E21.209 |

(Continued)

OTHER PUBLICATIONS

Thomas Schwarz; Floating Gate Basics; COEN 180; 2003; pp. 1-6; Santa Clara University; Santa Clara.

*Primary Examiner* — Alexander Ghyka

(57) ABSTRACT

A method for making a semiconductor structure includes forming an oxide layer onto non-volatile memory, high, and low voltage device regions of a substrate and forming a first gate material layer over the oxide layer. The first gate material layer is patterned to form a set of memory device select gates in the non-volatile memory device region and a set of gates in the high voltage device region. The patterning is performed while maintaining the oxide and first gate material layers over the low voltage device region. The method also includes forming a second gate material layer over the structure and forming a non-volatile storage layer between the set of select gates and the second gate material layer, from which a set of memory device control gates is patterned. Thereafter, the first gate material layer is patterned to form a set of gates in the low voltage device region.

16 Claims, 9 Drawing Sheets

(56) References Cited

U.S. PATENT DOCUMENTS

| | | |
|---|---|---|
| 7,902,022 B2 | 3/2011 | Kang et al. |
| 8,035,156 B2 | 10/2011 | Winstead et al. |
| 8,173,505 B2 | 5/2012 | Herrick et al. |
| 8,530,950 B1 | 9/2013 | Kang et al. |
| 8,871,598 B1 | 10/2014 | Perera |
| 8,877,585 B1 | 11/2014 | Perera et al. |
| 8,906,764 B2 | 12/2014 | Shroff et al. |
| 8,932,925 B1 | 1/2015 | Hong et al. |
| 2006/0208338 A1* | 9/2006 | Lee ........................ B82Y 10/00 257/516 |
| 2007/0093027 A1* | 4/2007 | Hashimoto ..... H01L 21/823462 438/264 |
| 2007/0284645 A1* | 12/2007 | Lee ........................ H01L 27/105 257/314 |
| 2012/0108051 A1* | 5/2012 | Zhou ..................... H01L 27/105 438/593 |
| 2015/0054044 A1 | 2/2015 | Perera et al. |
| 2015/0380408 A1* | 12/2015 | Hong .................. H01L 27/1203 257/391 |

\* cited by examiner

SEMICONDUCTOR STRUCTURE HAVING A DUAL-GATE NON-VOLATILE MEMORY DEVICE AND METHODS FOR MAKING SAME

FIELD

The present disclosure relates generally to semiconductor structures and more particularly to a semiconductor structure having a dual-gate non-volatile memory device and methods for making this structure.

BACKGROUND

The integration, during semiconductor device fabrication, of non-volatile memory (NVM) devices with other device structures, such as high voltage transistors and low voltage logic devices, is challenging. This is at least in part due to the different performance and/or operating requirements of the NVM devices, which store charge, and the other devices, which perform other functions. Accordingly, for some known semiconductor device fabrication processes, the high and low voltage devices are defined together in separate processing steps from the forming of the NVM devices. However, even this approach is becoming increasingly challenging. For example, a much reduced thermal budget and much thinner gate polysilicon and gate spacers make it difficult to obtain satisfactory breakdown voltages for the high voltage devices without incurring additional process cost and complexity.

BRIEF DESCRIPTION OF THE DRAWINGS

In the accompanying figures, like reference numerals refer to identical or functionally similar elements throughout the separate views. The figures together with the detailed description below are incorporated in and form part of the specification. Moreover, the figures and the detailed description serve to further illustrate embodiments of concepts that include the claimed embodiments and explain various principles and advantages of those embodiments.

Figure 1:
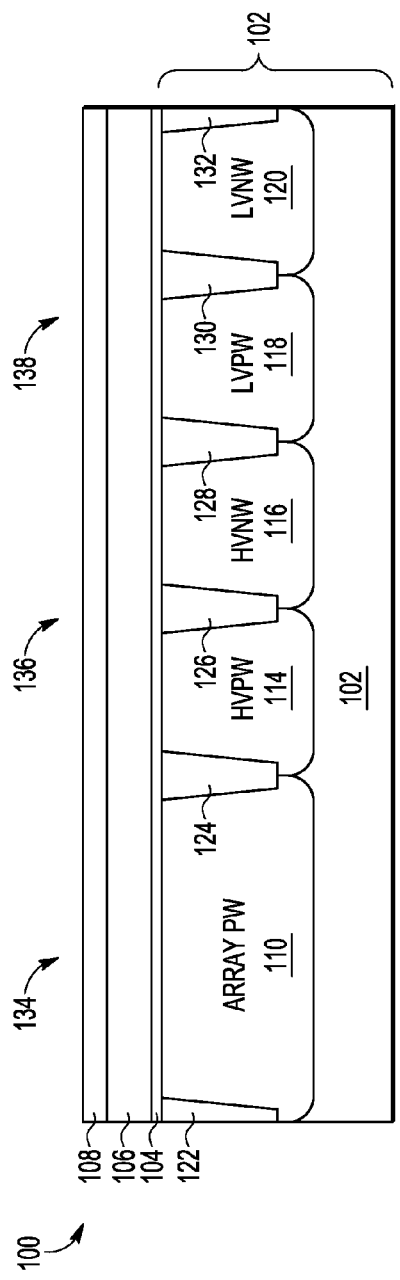
FIG. 1 illustrates a cross-section of a semiconductor structure having a dual-gate NVM device, at least one high voltage device, and at least one low voltage device at a stage of semiconductor device fabrication ("processing") in accordance with an embodiment.

Embodiments of the present disclosure are illustrated by way of example and are not limited by the accompanying figures. Elements in the figures are illustrated for simplicity and clarity and have not necessarily been drawn to scale. For example, the dimensions of some elements in the figures may be exaggerated relative to other elements to help to improve understanding of the embodiments.

The apparatus and method components have been represented where appropriate by conventional symbols in the drawings. Some drawings show only those specific details that are pertinent to understanding the embodiments, so as not to obscure the disclosure with details that will be readily apparent to those of ordinary skill in the art having the benefit of the description herein. Also, the functions included in any flow diagrams do not imply a required order of performing the functionality contained therein.

DETAILED DESCRIPTION

Embodiments are described for making a semiconductor structure having a dual-gate NVM device with a set of select and control gates, a set of high voltage devices, and a set of low voltage devices on a same substrate. An example embodiment provides a method for making a semiconductor structure that includes forming an oxide layer onto non-volatile memory, high voltage, and low voltage device regions of a substrate and forming a first gate material layer over the oxide layer in the non-volatile memory, high voltage, and low voltage device regions. The first gate material layer is patterned to form a set of memory device select gates in the non-volatile memory device region and a set of gates for a first set of high voltage devices in the high voltage device region. The patterning is performed while maintaining the oxide and first gate material layers over the low voltage device region.

The method further includes forming, at least over the set of memory device select gates, a second gate material layer and forming a non-volatile storage layer between the set of memory device select gates and the second gate material layer. The method additionally includes patterning the second gate material layer while maintaining the oxide and first gate material layers over the low voltage device region and removing some of the non-volatile storage layer to form a set of memory device control gates and corresponding charge storage structures between the control gates the select gates. After the patterning to form the gates in the non-volatile memory and high voltage device regions, the first gate material layer is patterned to form a set of gates for a set of low voltage devices in the low voltage device region.

Accordingly, at least one high voltage device shares processing steps with the NVM device. Namely, gates for one or more high voltage devices are simultaneously formed from a same polysilicon layer with the set of select gates for the NVM device. Additionally, for one embodiment, dopant implants (e.g., source/drain implants) for the one or more high voltage devices are annealed with dopant implants for the NVM select gates. Example benefits include one or more of: a thicker gate stack hard mask for the high voltage dopant implants, which lessens implant channeling and penetration through the gate stack and allows for a higher implant energy to be used; use of one or more annealing steps while forming the NVM and high voltage devices to improve the breakdown voltage of the high voltage devices; and flexibility in forming different types of high voltage devices, e.g., n-type metal-oxide-semiconductor (NMOS) devices versus p-type metal-oxide-semiconductor (PMOS) devices.

FIG. 1 illustrates a cross-sectional view of a semiconductor structure 100 at a stage of semiconductor device fabrication or processing. For example, the semiconductor structure 100 is a part or segment of an integrated circuit, such as a discrete NVM or a micro-controller unit (MCU) having an embedded NVM. For a particular embodiment, the NVM is a dual-gate flash memory, such as a split-gate thin-film storage (TFS) device. However, the present teachings are not limited to these example implementations.

The semiconductor structure 100 has a substrate 102 within which isolation regions 122, 124, 126, 128, 130, and 132 are formed. Moreover, formed in the substrate 102 are wells 110, 114, 116, 118, and 120. An oxide layer 104 is formed on the substrate 102 over the isolation regions 122, 124, 126, 128, 130, and 132 and the wells 110, 114, 116, 118, and 120. A first gate material layer 106 is formed on the oxide layer 104, and an anti-reflective coating (ARC) layer 108 is formed on the first gate material layer 106.

At least some of the isolation regions separate out or define regions of the substrate 102 within and upon which different device types are formed during the course of the fabrication process. Namely, isolation regions 122 and 124 define or separate out a non-volatile memory device region 134 of the substrate 102 within and upon which a set of one or more NVM memory devices, which in this case includes one or more memory cells also referred to as bit cells, is formed. Isolation regions 124 and 128 define or separate out a high voltage device region 136 of the substrate 102 within and upon which a set of one or more high voltage devices is formed. Isolation regions 128 and 132 define or separate out a low voltage device region 138 of the substrate 102 within and upon which a set of one or more low voltage devices is formed. Although not shown, the substrate 102 could also have other regions such as a medium voltage device region within and upon which one or more medium voltage devices are formed.

For an example, the high voltage devices are metal-oxide-semiconductor field-effect-transistors (MOSFETs) or other devices capable of handling, withstanding, or operating at 9 volts and above. For a particular embodiment, one or more of the high voltage devices formed in the high voltage device region 136 can be used to program and erase an NVM cell formed in the NVM device region 134. For another example, low voltage devices are logic transistors intended for high-speed operation and capable of handling, withstanding, or operating at 0.5 to 2 volts. For a further embodiment, medium voltage devices are capable of handling, withstanding, or operating at between 2 and 9 volts.

The substrate 102 described herein can be any semiconductor material or combination of materials, such as gallium arsenide, gallium nitride, silicon germanium, silicon-on-insulator (SOI), silicon, monocrystalline silicon, and the like. For a particular example, the substrate 102 is a p-type substrate. Oxide layer refers to a silicon oxide layer unless otherwise noted. Similarly, nitride layer refers to a silicon nitride layer unless otherwise noted.

For an embodiment, the isolation regions 122, 124, 126, 128, 130, and 132 are formed using a shallow trench isolation technique, whereby a pattern of trenches are etched in the substrate 102 and filled with a dielectric material such as oxide. As used herein, the terms or phrases patterning, patterned etch, and the like, of a material refer to a fabrication process step or steps whereby: a resist (a photoresist as in the case of photolithography) is applied to the material to be patterned (also referred to as the underlying material); a mask (a photomask as in the case of photolithography) is used to transfer a pattern to the resist; and parts, portions, or segments of the underlying material are removed or etched, for instance using a chemical agent, in accordance with the transferred pattern to leave a remaining structure. For an embodiment, the resist further acts as a temporary mask to protect areas where the underlying material is not etched during the patterning process. In a further embodiment, once the resist is no longer needed, it is removed from the underlying material.

The wells 110, 114, 116, 118, and 120 can be formed by selectively implanting a dopant into (also referred to herein as doping) areas at a given dose using a suitable implantation energy. For a particular embodiment, the areas that are to be implanted are defined after forming the isolation regions 122, 124, 126, 128, 130, and 132. This allows the isolation regions to serve as barriers to maintain dopants within certain defined areas. Moreover, the type of dopant implanted, at least in part, determines the type of device formed in the region of the implant.

As illustrated, well 110 is a p-well formed by doping the area between the isolation regions 122 and 124 using a p-type dopant, in order to later form one or more NVM cells, which are part of an NVM array, within the NVM device region 134 of the substrate 102. Well 114 is a p-well formed by doping the area between the isolation regions 124 and 126 using a p-type dopant, in order to later form one or more high voltage NMOS devices within the high voltage device region 136 of the substrate 102. Well 116 is an n-well formed by doping the area between the isolation regions 126 and 128 using an n-type dopant, in order to later form one or more high voltage PMOS devices within the high voltage device region 136 of the substrate 102. Well 118 is a p-well formed by doping the area between the isolation regions 128 and 130 using a p-type dopant, in order to later form one or more low voltage NMOS devices within the low voltage device region 138 of the substrate 102. Well 120 is an n-well formed by doping the area between the isolation regions 130 and 132 using an n-type dopant, in order to later form one or more low voltage PMOS devices within the low voltage device region 138 of substrate 102. Boron and indium are example p-type dopants. Phosphorus, arsenic, and antimony are example n-type dopants.

The oxide layer 104 is used as a dielectric for gate structures that are formed in the NVM 134, high voltage 136, and low voltage 138 device regions of the substrate 102 and, in one example, is grown rather than deposited for a higher quality. Moreover, although not specifically illustrated, the oxide layer 104 has different thicknesses in all or some of the regions 134, 136, and 138 of the substrate 102. The different thicknesses can be accomplished in different regions using multiple thermal oxidation steps. For example, a thicker oxide is grown first and patterned away in the area or areas that require a thinner oxide; then the thinner oxide is grown in the remaining exposed areas. For a particular embodiment, a thicker oxide is grown over the entire structure 100 and is then patterned away in the low voltage device region 138 and retained in the NVM device region 134 to support charge retention in the NVM cells formed thereon. The thicker oxide is also retained in the high voltage device region 136 to support the higher voltage requirements of the devices formed thereon. A thinner oxide is thereafter grown in the low voltage device region 138 while masking the thicker oxide in the regions 134 and 136.

Further illustrated, the first gate material layer 106, which can be a first polysilicon layer, is deposited on the oxide layer 104 in all of the regions 134, 136, and 138 of the substrate 102. The ARC layer 108, which can be a layer of silicon nitride, is deposited onto the first polysilicon layer 106 in all of the regions 134, 136, and 138 of the substrate 102.

Figure 2:
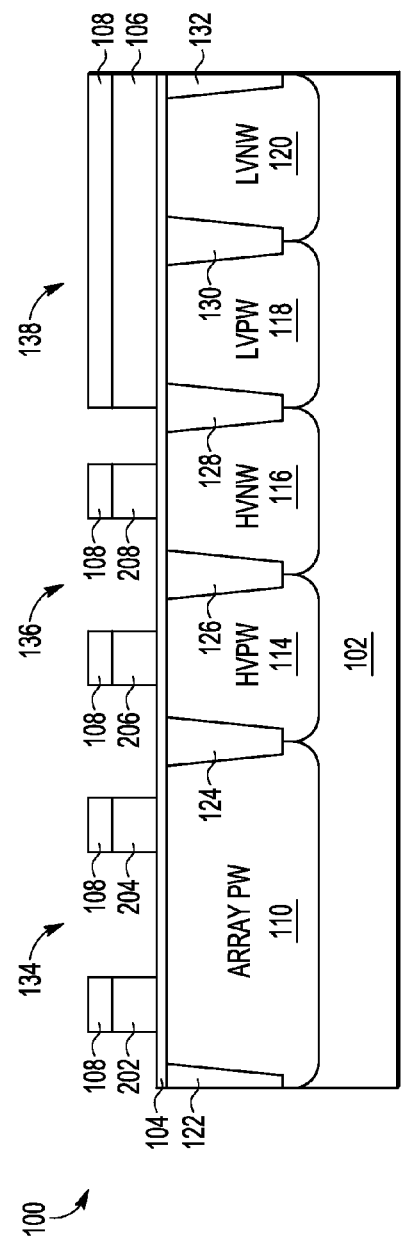
FIG. 2 illustrates a cross-section of the semiconductor structure of FIG. 1 at a subsequent stage of processing.

FIG. 2 illustrates the semiconductor structure 100 after patterning the first polysilicon layer 106 and the ARC layer 108 to form a set of memory device select gates 202 and 204 in the NVM device region 134 and a set of gates 206 and 208 for a first set of high voltage devices to be formed in the high voltage device region 136. The gates 206 and 208 are also referred to herein as high voltage gates. For one embodiment, the gates 206 and 208 are longer than the select gates 202 and 204 and are much longer than gates that will be formed in the low voltage device region 138. The patterning to form the gates 202, 204, 206, and 208 is performed while maintaining the oxide 104, first polysilicon 106, and ARC 108 layers over the low voltage device region 138 of the substrate 102. Moreover, during the patterning, the ARC layer 108 minimizes or eliminates reflecting of light off the polysilicon layer 106 from the photolithography procedure, to enable more accurate patterning. Additionally, after the patterning, portions of the ARC layer 108 remain over the gates 202, 204, 206, and 208 to facilitate subsequent processing steps.

For an embodiment, the gates 202, 204, 206, and 208 are simultaneously or concurrently patterned using the same photomask and photoresist layer. Moreover, the polysilicon of gates 202, 204, and 206 can be doped to improve conductivity. For example, the select gates 202 and 204 and the gate 206 for the NMOS device being formed in region 136 are pre-doped, prior to patterning, using an n-type dopant such as phosphorus. The n-type dopant is implanted while masking other areas that will not be doped.

Figure 3:
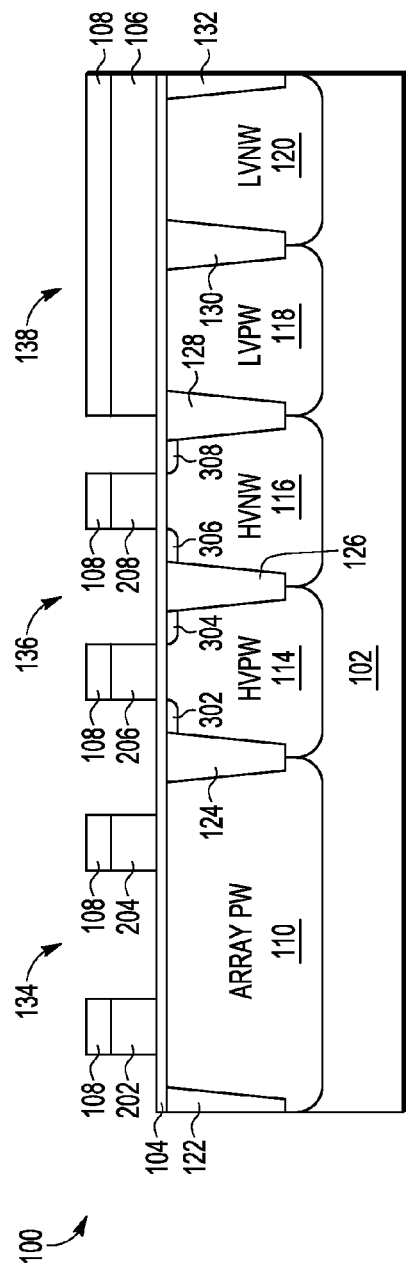
FIG. 3 illustrates a cross-section of the semiconductor structure of FIG. 2 at a subsequent stage of processing.

FIG. 3 illustrates the semiconductor structure 100 after forming dopant regions 302 and 304 in the p-well 114 adjacent (with the exception of the intervening gate oxide 104) to sidewalls of the gate 206 and after forming dopant regions 306 and 308 in the n-well 116 adjacent to sidewalls of the gate 208. Although not shown, the dopant regions 302, 304, 306, and 308 may also extend to some degree under the respective gates, but this is controllable to enable the desirable operating parameters for the devices being formed.

For example, the dopant regions 302 and 304 are source/drain regions formed by lightly doping the area adjacent to the gate 206 to a depth of less than the thickness of the gate stack 108/206, or a few hundred A, using an n-type dopant such as phosphorus, arsenic, and/or antimony and are, thereby, referred to herein as lightly doped drain (LDD) implants. Similarly, the dopant regions 306 and 308 are LDD source/drain implants formed by lightly doping the area adjacent to the gate 208 using a p-type dopant such as boron, indium, and/or boron fluoride.

For this embodiment, the implant regions 302, 304, 306, and 308 are "self-aligned." Accordingly, the p-well or n-well areas adjacent to the gates 206 or 208 are left exposed, while other areas of substrate 102 are masked by a protective coating to steer the implants 302, 304, or 306, and 308 into the exposed areas of the substrate 102. Edges of the implant regions 302 and 304 self-align with the sidewalls of the gate stack 108/206, and edges of the implant regions 306 and 308 self-align with the sidewalls of the gate stack 108/208 so that underlaps of the implants with the gate stacks (typically created by implant straggles and subsequent diffusion) is the same on both edges of the gate stacks and are not subject to photo misalignment.

Figure 4:
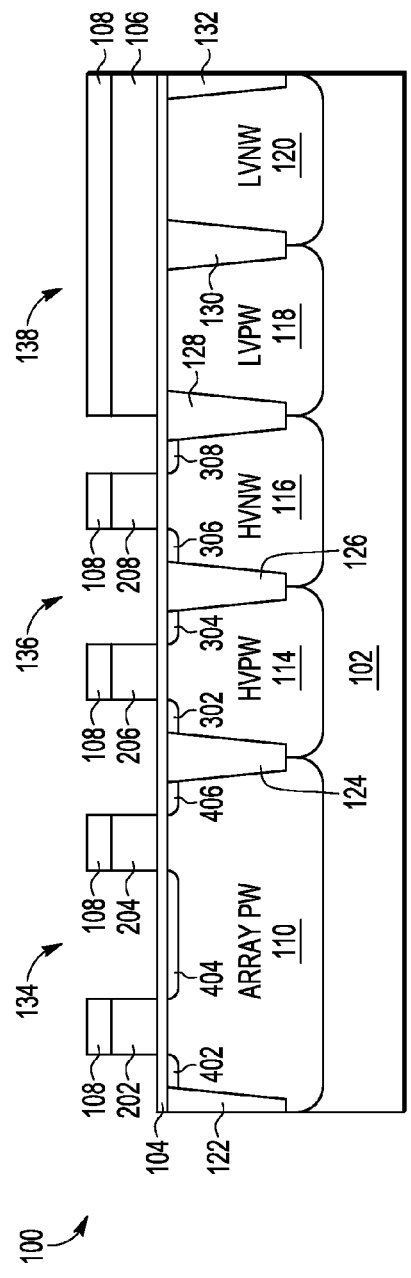
FIG. 4 illustrates a cross-section of the semiconductor structure of FIG. 3 at a subsequent stage of processing.

FIG. 4 illustrates the semiconductor structure 100 after forming dopant regions 402, 404, and 406, in the p-well 110, adjacent to sidewalls of the select gates 202 and 204. For example, the bit cells being formed in NVM device region 134 are NMOS devices. Accordingly, the dopant regions 402, 404, and 406 are formed by counter-doping the areas adjacent to the gates 202 and 204 using an n-type dopant such as phosphorus, arsenic, and/or antimony. These lightly doped implants may extend in a controlled manner underneath one or more of the gates 202 and 204 and are also self-aligned. Moreover, as shown, the dopant regions 302, 304, 306, 308, 402, 404, and 406 are formed while maintaining the oxide 104, first polysilicon 106, and ARC 108 layers over the low voltage device region 138 of the substrate 102.

After forming the dopant regions 402, 404, and 406, the structure 100 is rapid thermal annealed at a temperature that can be, for instance, around 1000° C. for about ten seconds. It should be noted, that for this embodiment (in contrast to the prior art), the devices formed in the high voltage device region 136 have dopant regions 302, 304, 306, and 308 that benefit from this anneal. Moreover, a thicker gate stack hard mask for the LDD implants 302, 304, 306, and 308 in the high voltage device region 136, due to the ARC layer 108, helps reduce implant channeling and penetration through the gate stack and allows for a higher implant energy to be used than is available in the prior art. The higher implant energy can drive the dopants deeper within the source/drain regions and lead to a higher breakdown voltage of the devices formed in the high voltage device region 136 without adding to the cost of the semiconductor fabrication process.

Figure 5:
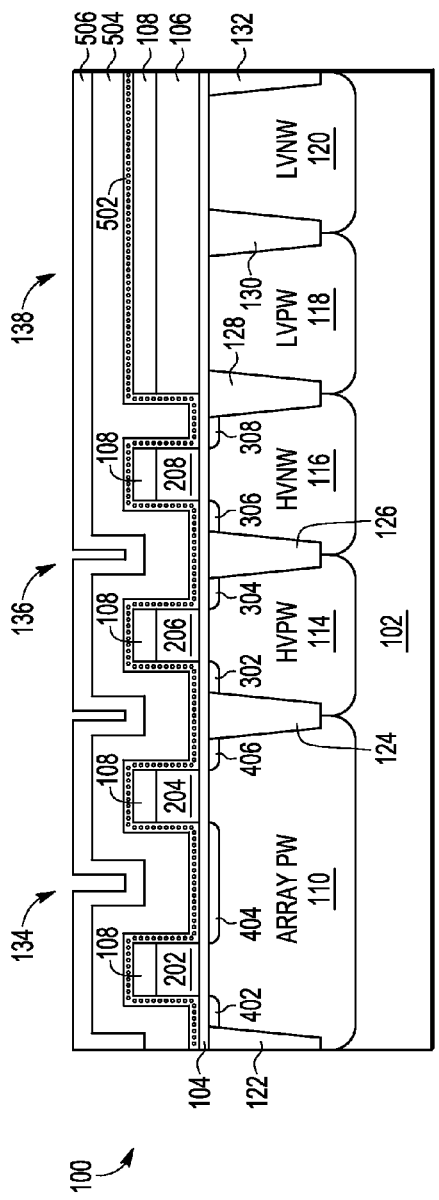
FIG. 5 illustrates a cross-section of the semiconductor structure of FIG. 4 at a subsequent stage of processing.

FIG. 5 illustrates the semiconductor structure 100 after forming a charge storage layer 502 onto the structure 100, forming a second gate material layer 504 onto the charge storage layer 502, and forming an ARC layer 506 onto the second gate material layer 504. As shown layers 502, 504, and 506 are formed in the regions 134, 136, and 138 of the substrate 102. For one embodiment, the charge storage layer is formed by: depositing an oxide layer onto the structure 100; depositing a plurality of nanocrystals, for instance a thin layer of small (e.g., less than 100 Å) silicon islands; and depositing another oxide layer onto and around the nanocrystals. The data state, e.g., a binary 1 or 0, can be persistently stored in the charge storage layer 502 of one or more NVM cells formed in the NVM device region 134.

For other embodiment, the charge storage layer 502 is formed differently. For one non-limiting example, the charge storage layer 502 comprises at least one nitride layer. For a particular implementation, the charge storage layer 502 is an ONO (oxide-nitride-oxide) stack. Such a memory technology is often referred to as SONOS (silicon-oxide-nitride-oxide-silicon).

Furthermore as with layers 106 and 108, the layers 504 and 506 can be a second polysilicon layer and a nitride layer, respectively. For an embodiment, the second polysilicon layer 504 is doped using an n-type dopant such as phosphorus. The n-type dopant can be implanted without masking other areas of the substrate 102.

For a particular embodiment, the formation of the charge storage layer 502 includes one or more anneals at a temperature between 800 and 1000° C. for a period of ten seconds to two hours each. The present teachings allow the LDD implants 302, 304, 306, and 308 to also receive these anneals, which could drive the dopants deeper within the source/drain regions and further improve the breakdown voltage of the devices formed in the high voltage device region 136 without adding to the cost of the semiconductor fabrication process.

Figure 6:
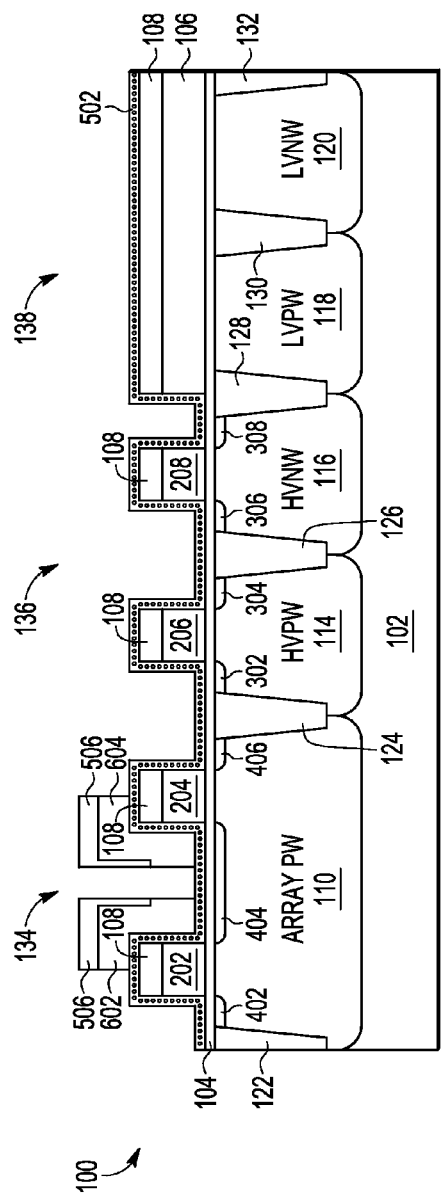
FIG. 6 illustrates a cross-section of the semiconductor structure of FIG. 5 at a subsequent stage of processing.

FIG. 6 illustrates the semiconductor structure 100 after patterning the polysilicon layer 504 and the ARC layer 506 to form a set of memory device control gates 602 and 604 in the NVM device region 134. For an embodiment, a different mask is used to pattern the gates 602 and 604 than is used to pattern the gates 202, 204, 206, and 208. Moreover, the gates 602 and 604 are formed while maintaining the oxide layer 104, first polysilicon layer 106, and ARC layer 108 over the low voltage device region 138 of the substrate. As illustrated, the control gate 602 is formed at least partially over the select gate 202, with the ARC layer 108 and charge storage layer 502 therebetween. Similarly, the control gate 604 is formed at least partially over the select gate 204, with the ARC layer 108 and charge storage layer 502 therebetween.

Figure 7:
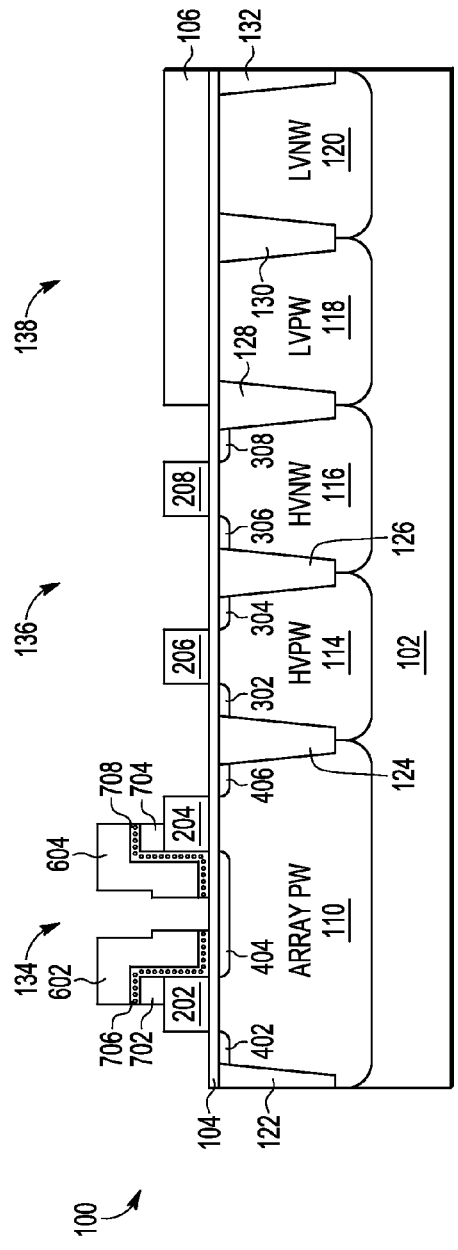
FIG. 7 illustrates a cross-section of the semiconductor structure of FIG. 6 at a subsequent stage of processing.

FIG. 7 illustrates the semiconductor structure 100 after an etch process, e.g., a dry and/or wet chemical etch, that removes or strips the ARC layer 506 from above the control gates 602 and 604. The etch process also removes some of the ARC layer 108 and some of the charge storage layer 502 from the structure 100. The resulting structure 100 includes a portion 702 of the ARC layer 108 and a portion 706 of the charge storage layer 502 (also referred to herein as a charge storage structure) between the select gate 202 and the control gate 602 of a first NVM cell. The portion 702 of the ARC layer 108 partially overlaps the top of the select gate 202. The charge storage structure 706 overlaps the portion 702, extends down a side of the portion 702, and extends down a sidewall of the select gate 202. The charge storage structure 706 also extends completely beneath the control gate 602, thereby, separating the control gate 602 from the select gate 202, the portion 702, and the dopant region 404.

The resulting structure 100 also includes a portion 704 of the ARC layer 108 and a portion 708 of the charge storage layer 502 between the select gate 204 and the control gate 604 of a second NVM cell. The portion 704 of the ARC layer 108 partially overlaps the top of the select gate 204. The charge storage structure 708 overlaps the portion 704, extends down a side of the portion 704, and extends down a sidewall of the select gate 204. The charge storage structure 708 also extends completely beneath the control gate 604, thereby, separating the control gate 604 from the select gate 204, the portion 704, and the dopant region 404. The charge storage structures 706 and 708 are configured to persistently store data such as a binary 1 or 0. Also, the portions 702 and 704 of the ARC layer 108 can create a higher breakdown voltage within the respective NVM cells.

Figure 8:
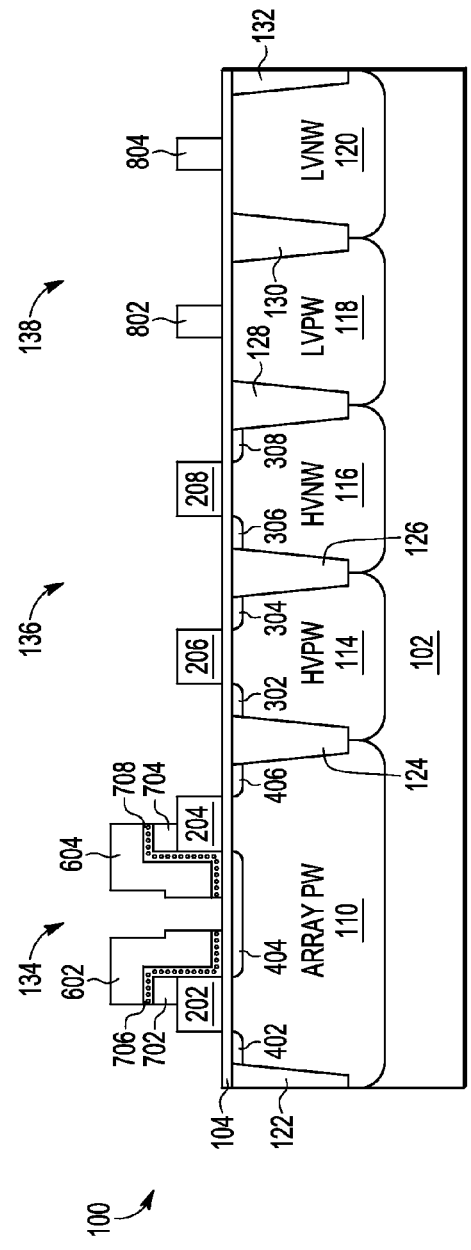
FIG. 8 illustrates a cross-section of the semiconductor structure of FIG. 7 at a subsequent stage of processing.
Figure 9:
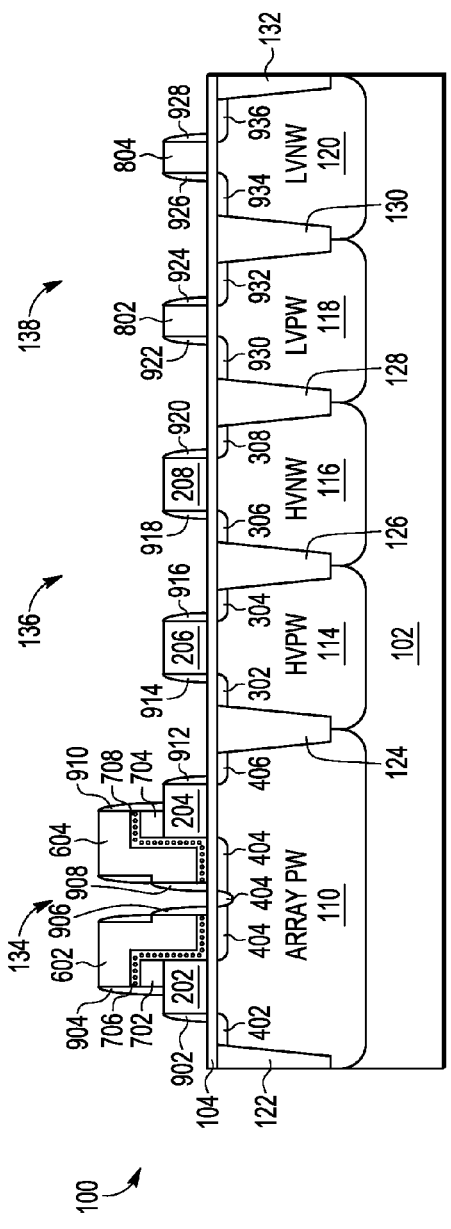
FIG. 9 illustrates a cross-section of the semiconductor structure of FIG. 8 at a subsequent stage of processing.

FIG. 8 illustrates the semiconductor structure 100 after patterning the first polysilicon layer 106 to form a set of gates 802 and 804 for a set of low voltage devices to be formed in the low voltage device region 138. The gates 802 and 804 are also referred to herein as low voltage gates. FIG. 9 illustrates the semiconductor structure 100 after forming spacer structures, or simply spacers, 902, 904, 906, 908, 910, 912, 914, 916, 918, 920, 922, 924, 926, and 928 adjacent to various sidewalls and after forming dopant regions 930, 932, 934, and 936 within the low voltage device region 138 of the substrate.

For an example, the spacers are formed by depositing a spacer material layer, e.g., a composite layer of oxide and nitride, and etching the composite layer back to the thickness desired. As shown, spacer 902 is formed adjacent to a sidewall of the select gate 202. Spacer 904 is formed adjacent to a first sidewall of the control gate 602. Spacer 906 is formed adjacent to a portion of a second sidewall of the control gate 602. Similarly, spacer 912 is formed adjacent to a sidewall of the select gate 204. Spacer 910 is formed adjacent to a first sidewall of the control gate 604. Spacer 908 is formed adjacent to a portion of a second sidewall of the control gate 604. Spacers 914 and 916 are formed adjacent to sidewalls of the gate 206. Spacers 918 and 920 are formed adjacent to sidewalls of the gate 208. Spacers 922 and 924 are formed adjacent to sidewalls of the gate 802. Spacers 926 and 928 are formed adjacent to sidewalls of the gate 804.

As illustrated, dopant regions 930 and 932 are formed in the p-well 118 adjacent to the sidewalls of the gate 802, and dopant regions 934 and 936 are formed in the n-well 120 adjacent to the sidewalls of the gate 804. For example, the dopant regions 930 and 932 are LDD source/drain implants formed by lightly doping the area adjacent to the gate 802 using an n-type dopant such as phosphorus, arsenic, and/or antimony. Similarly, the dopant regions 934 and 936 are LDD source/drain implants formed by lightly doping the area adjacent to the gate 804 using a p-type dopant such as boron, indium, and/or boron fluoride. The implants 930, 932, 934, and 936 may extend in a controlled manner underneath the respective gates 802 and 804 and are also self-aligned.

Additionally processing may be performed to further isolate the different elements within the devices, for instance by adding additional dielectric material near the dopant regions 402, 404, and 406 in the NVM device region 134 of the substrate 102. The semiconductor fabrication processing for the semiconductor structure 100 further includes back-end-of-line (BEOL) processing to create metal interconnecting wires that are isolated by dielectric layers (not shown).

Figure 10:
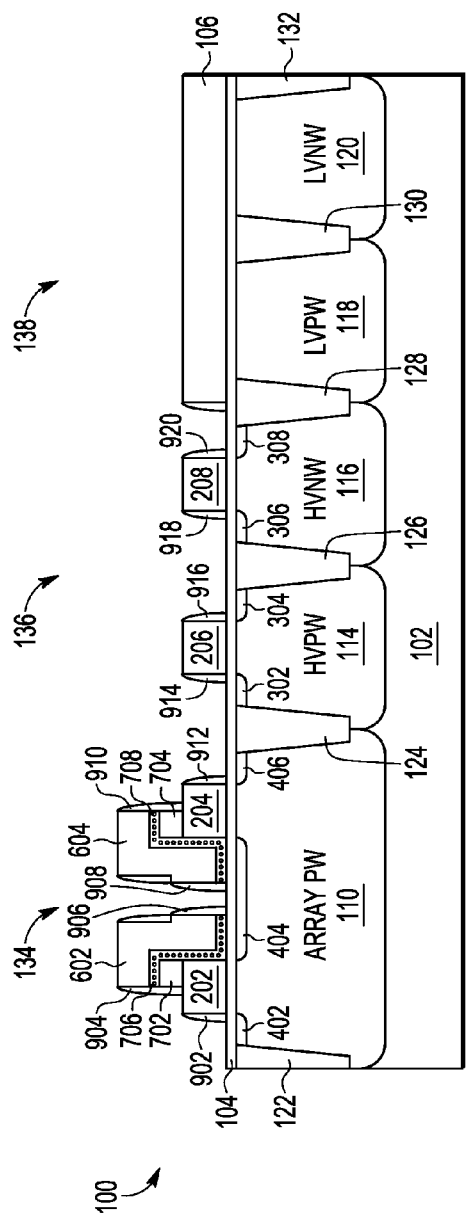
FIG. 10 illustrates a cross-section of the semiconductor structure of FIG. 7 at a subsequent stage of processing.

FIGS. 1-9 illustrate only some embodiments. However, the present teachings enable additional embodiments that allow for flexibility in the semiconductor fabrication processing for the semiconductor structure 100. For example, FIG. 9 illustrates an embodiment where all of the spacer structures formed in the non-volatile memory 134, high voltage 136, and low voltage 138 device regions of the substrate 102 are simultaneously formed and can have the same thickness and/or be fabricated using the same number of spacer material layers. However, FIG. 10 illustrates an alternative embodiment for forming spacer structures.

Particularly, the spacer structures 902, 904, 906, 908, 910, 912, 914, 916, 918, and 920 are formed in the non-volatile memory 134 and high voltage 136 device regions while maintaining the oxide 104 and first polysilicon 106 layers over the low voltage device region 138. Then, when the spacer structures 922, 924, 926, and 928 are subsequently formed, additional spacer structures are formed in the non-volatile memory 134 and high voltage 136 device regions. Accordingly, the spacer structures formed in the non-volatile memory 134 and high voltage 136 device regions have more spacer material layers than the spacer structures formed in the low voltage device region 138. This, at least in part, enables thicker spacer structures in the non-volatile memory 134 and high voltage 136 device regions to support the higher voltage requirements of the devices formed thereon.

Additional thickness in these spacer structures can also, at least in part, be optimized by design.

FIGS. 1-9 further illustrate an embodiment where a first anneal is performed after forming dopant regions 402, 404, and 406 in the NVM device region 134 but before forming the second polysilicon 504 and charge storage 502 layers. Moreover, all of the dopant regions 302, 304, 306, and 308 are formed in the high voltage device region 136 before forming the dopant regions 402, 404, and 406 in the NVM device region 134. For another embodiment, all the gates 206 and 208 formed in the high voltage device region 136 are formed with the select gates 202 and 204 in the NVM device region 134 as illustrated. However, all or some of the dopant regions 302, 304, 306, and 308 are formed after forming the dopant regions 402, 404, and 406.

For one example, only the dopant regions 302 and 304 for the high voltage NMOS device are formed before forming the dopant regions 402, 404, and 406 in the NVM device region 134. The dopant regions 306 and 308 for the high voltage PMOS device are formed after the anneal (described by reference to FIG. 4) but before depositing the charge storage 502, second polysilicon 504, and ARC 506 layers. For another example, only the dopant regions 306 and 308 for the high voltage PMOS device are formed before forming the dopant regions 402, 404, and 406 in the NVM device region 134. The dopant regions 302 and 304 for the high voltage NMOS device are formed after the anneal (described by reference to FIG. 4) but before depositing the charge storage 502, second polysilicon 504, and ARC 506 layers. For yet another example, all of the dopant regions 302, 304, 306, and 308 are formed after the anneal (described by reference to FIG. 4) but before depositing the charge storage 502, second polysilicon 504, and ARC 506 layers.

The alternative embodiments, described in the preceding paragraph, allow the source/drain regions for the various high voltage devices to see different levels of heat to better control the depth of the dopant implants. Moreover, even where none of the dopant regions receive or see the anneals used to form the NVM device in the NVM device region 134, this embodiment could for instance be combined with the embodiment described by reference to FIG. 10 to form larger or wider spacer structures adjacent to the sidewalls of the gates 206 and 208 formed in the high voltage device region 136.

FIGS. 1-9 also illustrate an embodiment where all of the gates for the high voltage device region 136 are formed simultaneously with the select gates in the NVM device region 134. FIGS. 11-14 illustrate an embodiment where only the set of gates (in this case gate 206) for only one or more high voltage NMOS devices is formed with the select gates 202 and 204. Whereas, the gate 208 is formed simultaneously with forming the gates 802 and 804 in the low voltage device region 138. By contrast, FIGS. 15-18 illustrate an embodiment where only the set of gates (in this case gate 208) for only one or more high voltage PMOS devices is formed with the select gates 202 and 204. Whereas, the gate 206 is formed simultaneously with forming the gates 802 and 804 in the low voltage device region 138.

Figure 11:
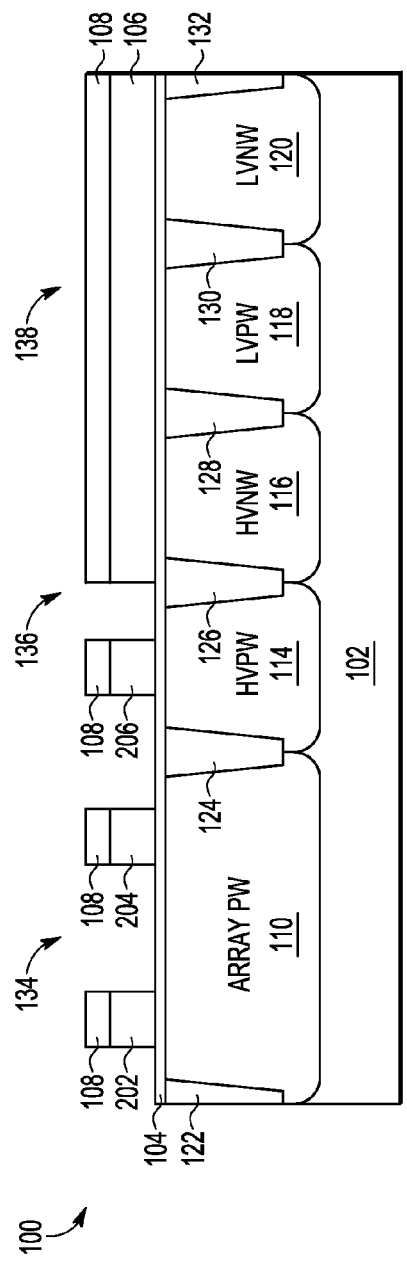
FIG. 11 illustrates a cross-section of the semiconductor structure of FIG. 1 at a subsequent stage of processing.
Figure 12:
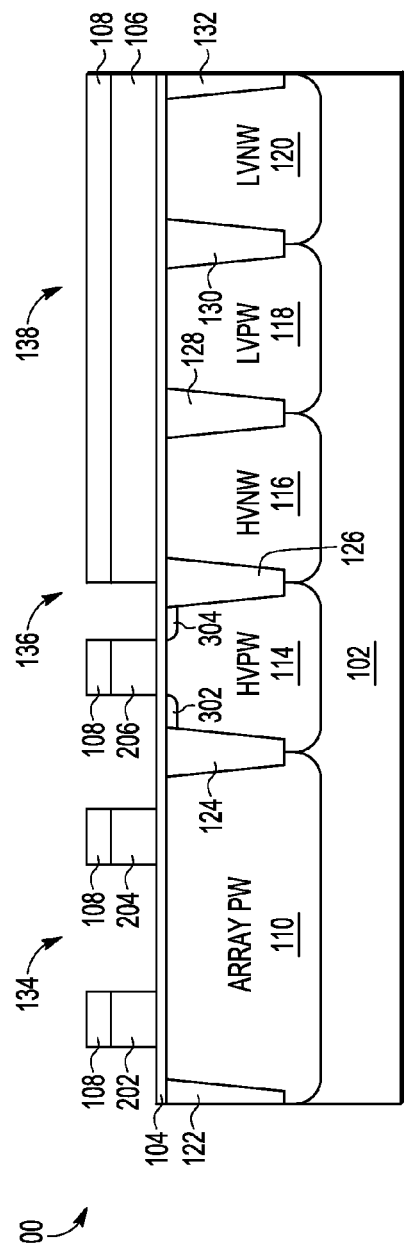
FIG. 12 illustrates a cross-section of the semiconductor structure of FIG. 11 at a subsequent stage of processing.

Particularly, FIG. 11 illustrates the semiconductor structure 100 of FIG. 1 after patterning the first polysilicon layer 106 and the ARC layer 108 to form the select gates 202 and 204 in the NVM device region 134 and the gate 206 for a first set of high voltage devices to be formed in a first segment, e.g., the HV p-well 114, of the high voltage device region 136. The patterning to form the gates 202, 204, and 206 is performed while maintaining the oxide 104, first polysilicon 106, and ARC 108 layers over the low voltage device region 138 of the substrate 102 and over a second segment, e.g., the HV n-well 116, of the high voltage device region 136. FIG. 12 illustrates the semiconductor structure 100 after implanting dopant regions 302 and 304 in the p-well 114 adjacent to the sidewalls of the gate 206.

Figure 13:
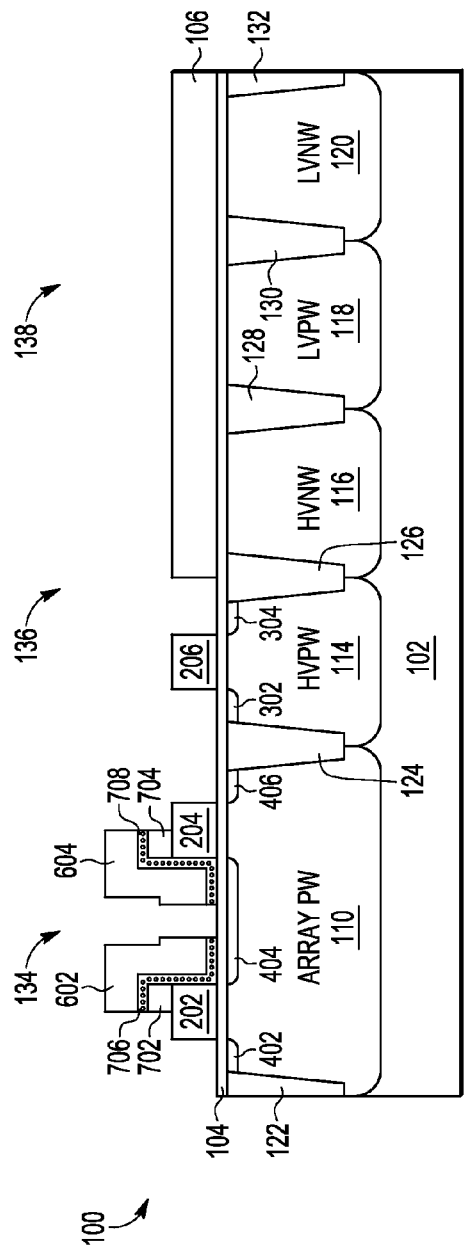
FIG. 13 illustrates a cross-section of the semiconductor structure of FIG. 12 at a subsequent stage of processing.
Figure 14:
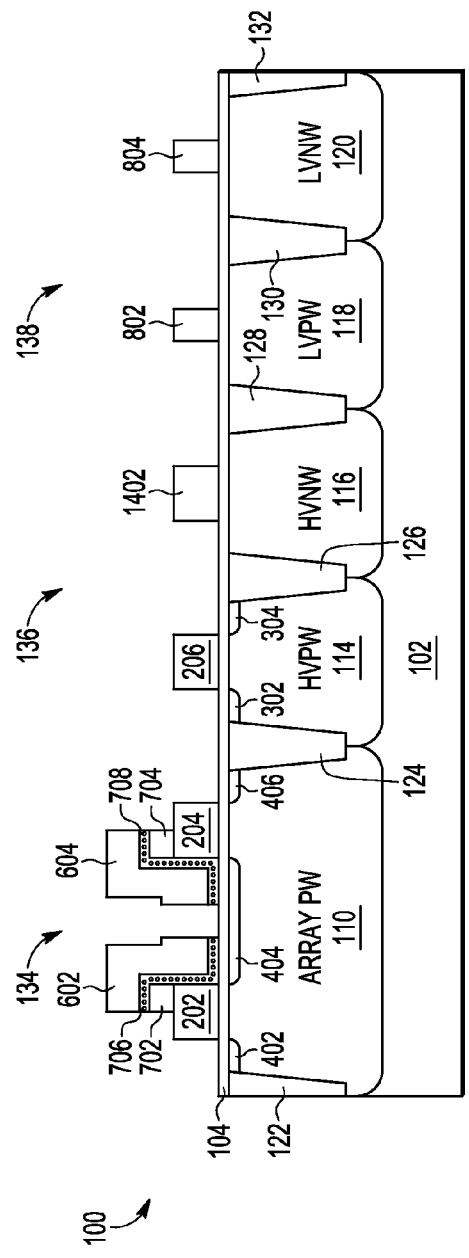
FIG. 14 illustrates a cross-section of the semiconductor structure of FIG. 13 at a subsequent stage of processing.

FIG. 13 illustrates the semiconductor structure 100 after implanting the dopant regions 402, 404, and 406 in the p-well 110 of the NVM device region 134, patterning the second polysilicon 504 and the ARC 506 layers to form the control gates 602 and 604, and stripping the charge storage layer 502 and ARC layers 108 and 506 to form the portions 702 and 704 of the ARC layer 108 and the charge storage structures 706 and 708 between the select gates 202 and 204 and the control gates 602 and 604. FIG. 14 illustrates the semiconductor structure 100 after patterning the remaining first polysilicon layer 106 to form a gate 1402 for a second set of high voltage devices to be formed over the HV n-well 116 of the high voltage device region 136 and to form the gates 802 and 804 in the low voltage device region 138. The processing proceeds as described by reference to FIG. 9 and then to the BEOL processing.

Figure 15:
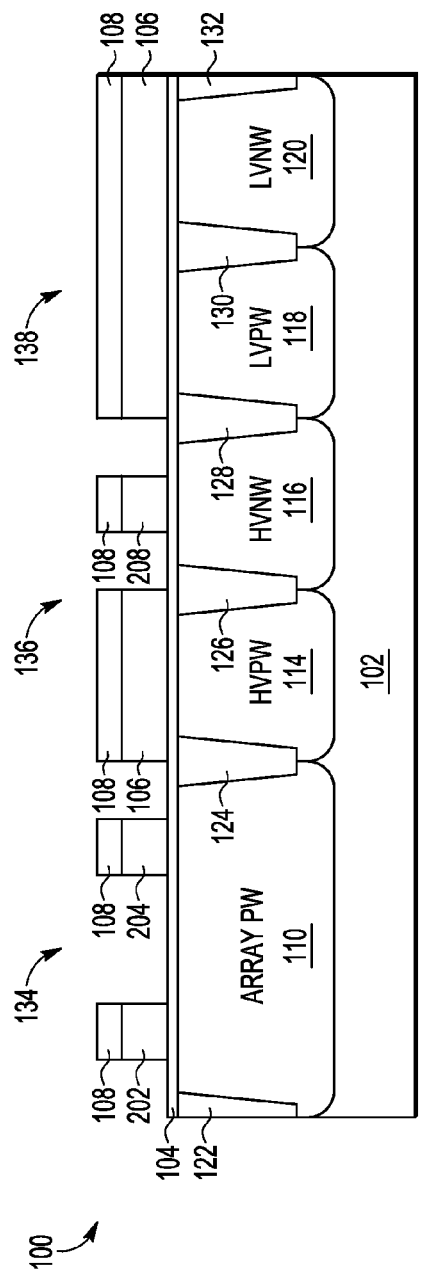
FIG. 15 illustrates a cross-section of the semiconductor structure of FIG. 1 at a subsequent stage of processing.
Figure 16:
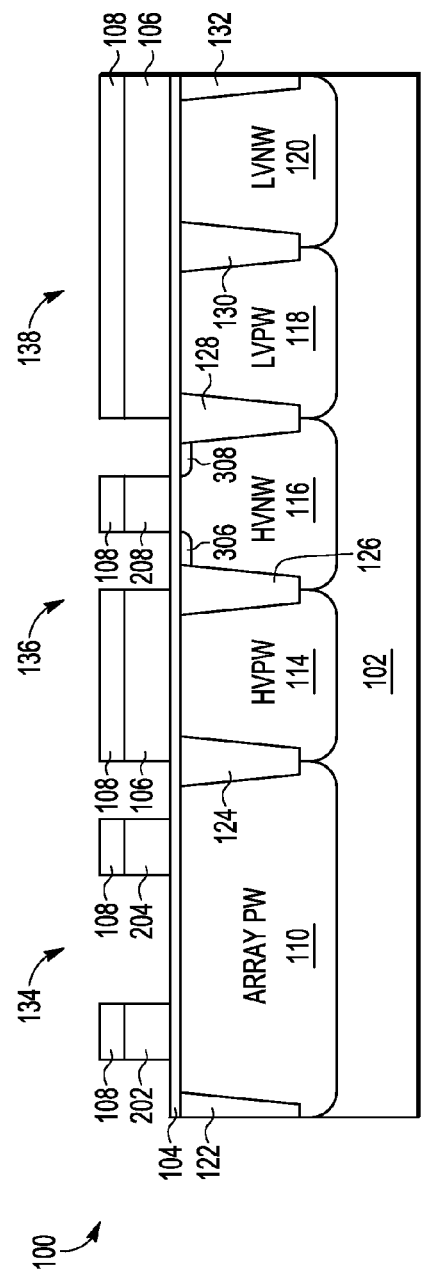
FIG. 16 illustrates a cross-section of the semiconductor structure of FIG. 15 at a subsequent stage of processing.

FIG. 15 illustrates the semiconductor structure 100 of FIG. 1 after patterning the first polysilicon layer 106 and the ARC layer 108 to form the select gates 202 and 204 in the NVM device region 134 and the gate 208 for a first set of high voltage devices to be formed in a first segment, e.g., the HV n-well 116, of the high voltage device region 136. The patterning to form the gates 202, 204, and 208 is performed while maintaining the oxide 104, first polysilicon 106, and ARC 108 layers over the low voltage device region 138 of the substrate 102 and over a second segment, e.g., the HV p-well 114, of the high voltage device region 136. FIG. 16 illustrates the semiconductor structure 100 after implanting dopant regions 306 and 308 in the n-well 116 adjacent to the sidewalls of the gate 208.

Figure 17:
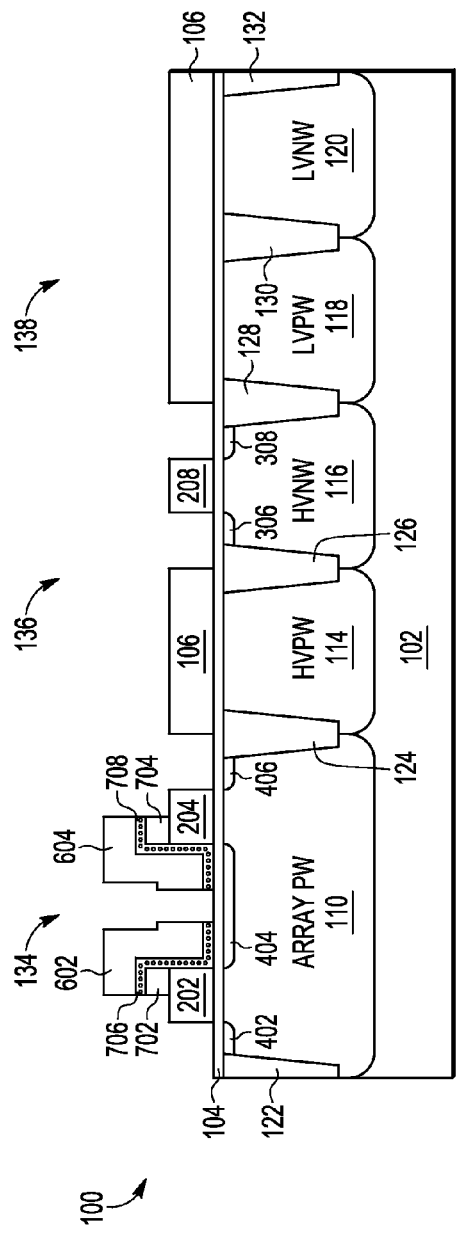
FIG. 17 illustrates a cross-section of the semiconductor structure of FIG. 16 at a subsequent stage of processing.
Figure 18:
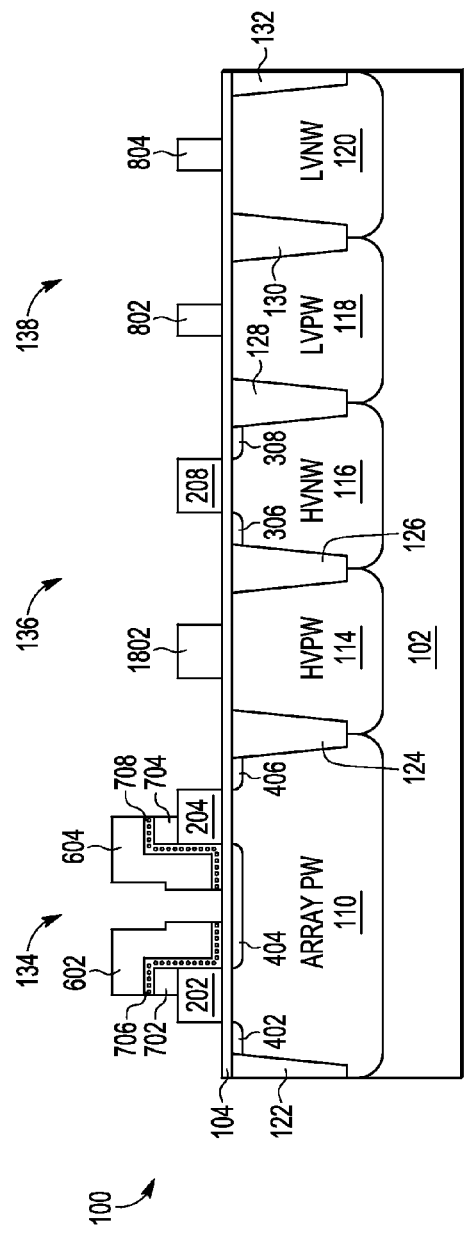
FIG. 18 illustrates a cross-section of the semiconductor structure of FIG. 17 at a subsequent stage of processing.

FIG. 17 illustrates the semiconductor structure 100 after implanting the dopant regions 402, 404, and 406 in the p-well 110 of the NVM device region 134, patterning the second polysilicon 504 and the ARC 506 layers to form the control gates 602 and 604, and stripping the charge storage layer 502 and ARC layers 108 and 506 to form the portions 702 and 704 of the ARC layer 108 and the charge storage structures 706 and 708 between the select gates 202 and 204 and the control gates 602 and 604. FIG. 18 illustrates the semiconductor structure 100 after patterning the remaining first polysilicon layer 106 to form a gate 1802 for a second set of high voltage devices to be formed over the HV p-well 114 of the high voltage device region 136 and to form the gates 802 and 804 in the low voltage device region 138. The processing proceeds as described by reference to FIG. 9 and then to the BEOL processing.

By now it should be appreciated that there has been provided a method for making a semiconductor structure. The method includes forming, in a non-volatile memory device region of a substrate, a non-volatile memory device having at least one non-volatile memory cell comprising a select gate, a charge storage structure, and a control gate operatively coupled and first dopant regions formed within the substrate adjacent to the select gates. The method also includes forming, in a high voltage device region of the substrate, a set of high voltage devices each having a high voltage gate and second dopant, e.g., source and drain, regions formed within the substrate adjacent to the high voltage gates and forming, in a low voltage device region of the substrate, a set of low voltage devices each having a low voltage gate and third dopant, e.g., source and drain, regions formed within the substrate adjacent to the low voltage gates. The one or more select gates and at least a first portion of the high voltage gates are concurrently patterned from a first gate material layer formed on the substrate, wherein the patterning is performed while the first gate material layer covers the low voltage device region. The one or more low voltage gates are patterned from the first gate material layer after patterning the one or more select gates and the first portion of high voltage gates and after patterning the one or more control gates from a second gate material layer.

The method further includes performing a first anneal after forming the first dopant regions within the non-volatile memory device region of the substrate but before patterning the one or more control gates. For one embodiment, a first subset of the second dopant regions formed in the high voltage device region of the substrate is formed before forming the first dopant regions within the non-volatile memory device region of the substrate, and a second subset of the second dopant regions is formed after the first anneal. For another embodiment, all the second dopant regions formed in the high voltage device region of the substrate are formed after the first anneal.

Additionally, a second portion of the high voltage gates may be concurrently patterned from the first gate material layer with the patterning of the low voltage gates. Moreover, the method may include forming spacer structures adjacent to at least one sidewall of the one or more gates in the non-volatile memory device region and adjacent to at least one side wall of the first portion of high voltage gates, wherein the spacer structures are formed before patterning the one or more low voltage gates.

Further disclosed is a semiconductor structure having: a substrate having non-volatile memory, high voltage, and low voltage device regions; a set of memory device select gates formed, in the non-volatile memory device region of the substrate, from a first polysilicon layer; a set of memory device control gates formed, in the non-volatile memory device region of the substrate, from a second polysilicon layer; a set of charge storage structures formed between the set of memory device select gates and memory device control gates; a first set of gates formed, in the high voltage device region of the substrate, from the first polysilicon layer; and a second set of gates formed, in the low voltage device region of the substrate, from the first polysilicon layer. The set of memory device select gates and at least a first portion of the first set of gates are formed using a first mask, and the second set of gates is formed using a second mask.

For one embodiment, a second portion of the first set of gates is formed using the second mask. For another embodiment, the set of charge storage structures includes a plurality of nanocrystals. For yet another embodiment, the semiconductor structure further includes a first set of spacer structures formed adjacent to at least one sidewall of each of the control gates, the select gates, and the first portion of the first set of gates and a second set of spacer structures formed adjacent to at least one sidewall of each of the second set of gates. The spacer structures in the first set of spacer structures have more spacer material layers than the spacer structures in the second set of spacer structures.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to semiconductor device fabrication (including those using conventional CMOS technology), CMOS devices, MOSFETs, and other functional aspects of the structures (and the individual operating components of the structures) formed thereby, such as the thickness of various layers and the depth of various implants, may not be described in detail. Furthermore, a variety of well-known and common semiconductor materials may be used including those already mentioned and others not specifically referred to herein and combinations thereof.

The terms "configured to", "configured with", "arranged to", "arranged with", "capable of" and any like or similar terms means that referenced circuit elements have an internal physical arrangement such as by virtue of physical coupling and/or connectivity with other circuit elements in an inactive state. This physical arrangement and/or physical coupling and/or connectivity while in the inactive state enables the circuit elements to perform stated functionality while in the active state of receiving and processing various signals at inputs of the circuit elements to generate signals at the output of the circuit elements. A device or structure that is "configured" in a certain way is configured in at least that way, but may also be configured in ways that are not described. Furthermore, in this document, relational terms such as first and second, top and bottom, and the like may be used solely to distinguish one entity or action from another entity or action without necessarily requiring or implying any actual such relationship or order between such entities or actions.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for making a semiconductor structure, the method comprising:
   forming an oxide layer onto non-volatile memory, high voltage, and low voltage device regions of a substrate;
   forming a first gate material layer over the oxide layer in the non-volatile memory, high voltage, and low voltage device regions;
   patterning the first gate material layer to form a set of memory device select gates in the non-volatile memory device region and a set of gates for a first set of high voltage devices in the high voltage device region, wherein the patterning is performed while maintaining the oxide and first gate material layers over the low voltage device region;
   forming, at least over the set of memory device select gates, a second gate material layer and forming a charge storage layer between the set of memory device select gates and the second gate material layer;

patterning the second gate material layer while maintaining the oxide and first gate material layers over the low voltage device region and removing some of the charge storage layer to form a set of memory device control gates and corresponding charge storage structures between the control gates the select gates;

patterning the first gate material layer, after the patterning to form the gates in the non-volatile memory and high voltage device regions, to form a set of gates for a set of low voltage devices in the low voltage device region.

2. The method of claim 1 further comprising:

forming first dopant regions within the substrate adjacent to at least first sidewalls of each gate of the set of memory device select gates;

forming second dopant regions within the substrate adjacent to first and second sidewalls of each gate for the first set of high voltage devices, wherein the first and second dopant regions are formed while maintaining the oxide and first gate material layers over the low voltage device region;

forming third dopant regions within the substrate adjacent to first and second sidewalls of each gate for the set of low voltage devices.

3. The method of claim 2 further comprising performing a first anneal after forming the first dopant regions but before forming the second gate material and charge storage layers.

4. The method of claim 3, wherein at least a first subset of the second dopant regions is formed before the first dopant regions.

5. The method of claim 4, wherein a second subset of the second dopant regions is formed after performing the first anneal.

6. The method of claim 2, wherein the second dopant regions are formed after performing the first anneal.

7. The method of claim 1 further comprising patterning the first gate material layer to form a set of gates for a second set of high voltage devices in the high voltage device region concurrently with the patterning to form the set of gates for the set of low voltage devices in the low voltage device region.

8. The method of claim 7 wherein:

the patterning to form the set of gates for the first set of high voltage devices comprises patterning to form a set of gates for only PMOS devices;

the patterning to form the set of gates for the second set of high voltage devices comprises patterning to form a set of gates for only NMOS devices.

9. The method of claim 1 further comprising forming spacer structures adjacent to at least one sidewall of each gate formed in the non-volatile memory, high voltage, and low voltage device regions of the substrate, wherein some of the spacer structures are formed in the non-volatile memory and high voltage device regions while maintaining the oxide and first gate material layers over the low voltage device region.

10. A method for making a semiconductor structure having a non-volatile memory device, the method comprising:

forming, in a non-volatile memory device region of a substrate, a non-volatile memory device having at least one non-volatile memory cell comprising a select gate, a charge storage structure, and a control gate operatively coupled and first dopant regions formed within the substrate adjacent to the select gates;

forming, in a high voltage device region of the substrate, a set of high voltage devices each having a high voltage gate and second dopant regions formed within the substrate adjacent to the high voltage gates;

forming, in a low voltage device region of the substrate, a set of low voltage devices each having a low voltage gate and third dopant regions formed within the substrate adjacent to the low voltage gates;

wherein the one or more select gates and at least a first portion of the high voltage gates are concurrently patterned from a first gate material layer formed on the substrate, wherein the patterning is performed while the first gate material layer covers the low voltage device region, and wherein the one or more low voltage gates are patterned from the first gate material layer after patterning the one or more select gates and the first portion of high voltage gates and after patterning the one or more control gates from a second gate material layer.

11. The method of claim 10 further comprising performing a first anneal after forming the first dopant regions within the non-volatile memory device region of the substrate but before patterning the one or more control gates.

12. The method of claim 11, wherein at least a first subset of the second dopant regions formed in the high voltage device region of the substrate is formed before forming the first dopant regions within the non-volatile memory device region of the substrate.

13. The method of claim 12, wherein a second subset of the second dopant regions is formed after the first anneal.

14. The method of claim 11, wherein the second dopant regions formed in the high voltage device region of the substrate are formed after the first anneal.

15. The method of claim 10 wherein a second portion of the high voltage gates are concurrently patterned from the first gate material layer with the patterning of the low voltage gates.

16. The method of claim 10 further comprising forming spacer structures adjacent to at least one sidewall of the one or more gates in the non-volatile memory device region and adjacent to at least one side wall of the first portion of high voltage gates, wherein the spacer structures are formed before patterning the one or more low voltage gates.

* * * * *